United States Patent
Black

(10) Patent No.: US 6,774,351 B2
(45) Date of Patent: Aug. 10, 2004

(54) LOW-POWER SURFACE FOR AN OPTICAL SENSOR

(75) Inventor: Robert Arthur Black, Milpitas, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 62 days.

(21) Appl. No.: 09/865,376

(22) Filed: May 25, 2001

(65) Prior Publication Data

US 2002/0175274 A1 Nov. 28, 2002

(51) Int. Cl.[7] .................................................. H01J 3/14
(52) U.S. Cl. .................... 250/216; 250/221; 345/166
(58) Field of Search ................................. 250/216, 221, 250/557, 208.1, 559.44, 559.29, 237 R, 237 G, 559.01, 55, 556, 559.32; 345/163–167

(56) References Cited

U.S. PATENT DOCUMENTS

| | | | | |
|---|---|---|---|---|
| 4,647,771 A | * | 3/1987 | Kato | 250/221 |
| 4,807,166 A | * | 2/1989 | Zalenski | 250/221 |
| 5,288,993 A | * | 2/1994 | Bidiville et al. | 250/221 |
| 5,426,498 A | * | 6/1995 | Brueck et al. | 356/35.5 |
| 6,222,174 B1 | * | 4/2001 | Tullis et al. | 250/208.1 |
| 6,618,038 B1 | * | 9/2003 | Bohn | 345/164 |

\* cited by examiner

Primary Examiner—Thanh X. Luu
(74) Attorney, Agent, or Firm—Judy Liao Shie

(57) ABSTRACT

A surface having specular regions shaped to reflect incident light toward an optical sensor provides an ideal surface to be scanned by an optical mouse. When light is shined upon the surface, the reflections off of the specular regions appear as white points in the image acquired by the optical sensor, which gives the optical sensor the distinguishing characteristics it needs to differentiate between images. Since the specular regions reflect light so well, less light is needed to obtain an image, and power is conserved. The surface appears as a dark background in the image, providing contrast to the light reflecting off the specular regions. To protect the specular regions, an optically transparent coating can be layered on top of the surface. An alternative surface that may be easier to manufacture is a light colored surface dotted with darker colored regions.

8 Claims, 6 Drawing Sheets

LOW-POWER SURFACE FOR AN OPTICAL SENSOR

BACKGROUND OF THE INVENTION

The present invention relates generally to the field of mousepads and, more particularly, to the field of mousepads for optical mice.

Most computers now have an input device that controls the movement of a cursor on a computer screen. Examples of such devices include trackballs, joysticks, and mice. A common form of the mouse is a mechanical mouse; it has a small ball on its underside in contact with the surface upon which the mouse rests. When the mouse is moved, the ball rolls and activates sensors in the mouse that translate the rolling of the ball into movement of the cursor on the computer screen. Another kind of mouse is an optical mouse. The optical mouse has an optical sensor that scans a surface and acquires a series of images of the surface. The optical mouse determines its own position relative to the surface by comparing the differences between consecutive images.

A typical optical mouse illuminates the surface it is scanning, generating shadows and reflections used by the optical sensor to acquire a good image. Depending on the surface type, the amount of light needed can vary. For instance, a dark surface absorbs light, requiring more light to adequately illuminate the surface in order for the optical sensor to acquire a usable image. The more light used by the optical mouse, however, the more power it consumes. This is a problem for low-power applications such as battery operated cordless mice, or for laptop computer users.

The performance of the optical mouse also depends on the surface that it scans. If a surface is too homogeneous, the images acquired by the optical sensor while the optical mouse is moving will all be very similar, perhaps even identical. Since the optical mouse depends on differences between images to determine its position relative to the surface, similar images trick it into thinking that it has not changed position, when in fact it has. It is therefore important that the surface has enough distinguishing characteristics to eliminate such confusion.

SUMMARY OF THE INVENTION

A surface having specular regions shaped to reflect incident light towards the optical sensor provides an ideal surface to be scanned by the optical mouse. When light is shined upon the surface, the reflections off of the specular regions appear as bright white points in the image acquired by the optical sensor, which gives the optical sensor the distinguishing characteristics it needs to differentiate between images. Since the specular regions reflect light so well, less light is needed to obtain an image, so power is conserved. The surface itself should either reflect light away from the optical sensor, or at least scatter light, so that it appears in the image to the optical sensor as a dark background, providing contrast to the light reflecting off of the specular regions.

In accordance with an illustrated preferred embodiment of the present invention, the specular regions are depressions that are either made of, or are coated with, a specular material, and are shaped to reflect incident light toward the optical sensor. The surface is made of or coated with a specular material as well, or a material that scatters light. The reflections off of the depressions give the surface its distinguishing characteristics so the mouse is able to differentiate between images as it moves. Additionally, the brightness of the reflections helps the mouse conserve power.

In another embodiment of the present invention, a surface is dotted with protrusions that reflect incident light toward the optical sensor. The protrusions are also either made of, or are coated with, a specular material, and perform the same function as the depressions.

In a third embodiment of the present invention, the surface, whether dotted with depressions or protrusions, is coated with an optically transparent material that protects the surface from contamination or damage. The optically transparent material still allows light to pass through, but prevents the optical mouse from eroding away the specular regions as it traverses over the surface.

In a fourth embodiment of the present invention, the surface has contrasting regions of two colors: one light, one dark. The lighter color is used in the background of the surface to minimize power consumption. The darker colored regions provide distinguishing characteristics on the surface for the optical sensor. Unlike the depressions and protrusions, however, the dark-colored regions do not reflect light well. As a result, when the optical sensor scans the surface, the dark colored regions appear to it as dark spots against a lighter background. This embodiment does not conserve as much power as the embodiments with the specular regions, but a colored surface may be easier to manufacture than a surface with depressions or protrusions.

Further features and advantages of the present invention, as well as the structure and operation of preferred embodiments of the present invention, are described in detail below with reference to the accompanying exemplary drawings. In the drawings, like reference numbers indicate identical or functionally similar elements.

DETAILED DESCRIPTION OF THE PREFERRED EMBODIMENT

The present invention is a surface that is scanned by an optical sensor of a relative position determinator such as an optical mouse or a trackball device. The surface has characteristics to reduce the amount of power needed by the optical mouse in order to light the surface, and so it can easily differentiate between the images the optical sensor acquires of the surface.

Figure 1:
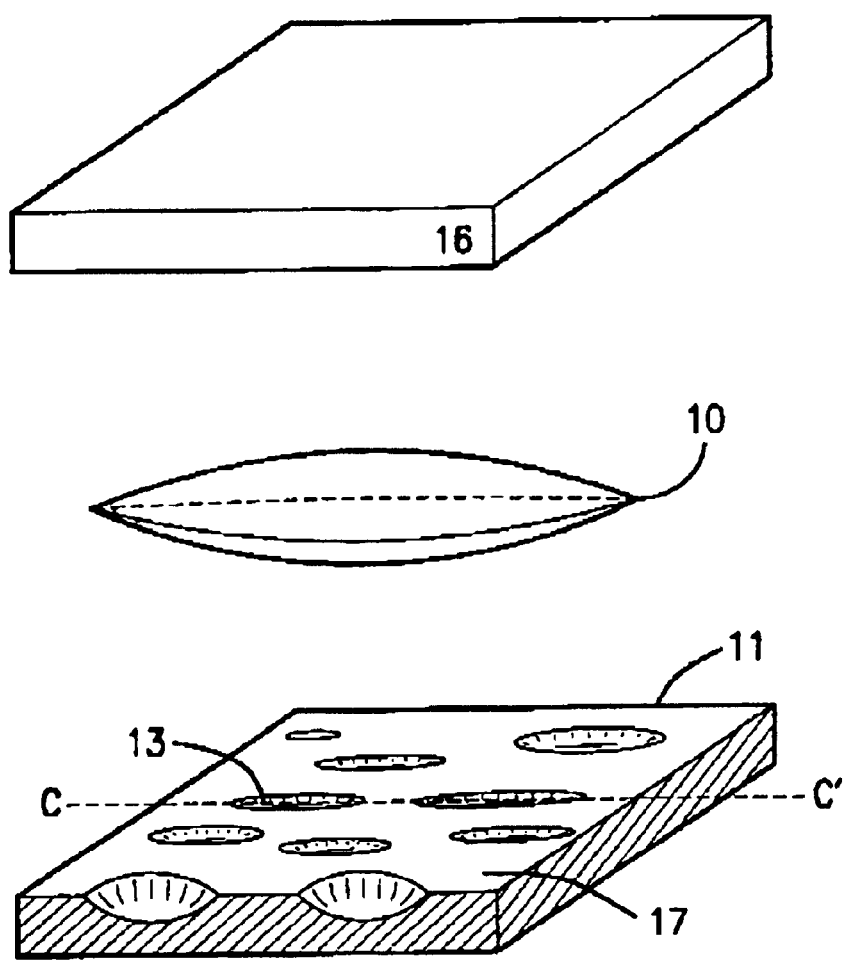
FIG. 1 is a three-dimensional view of a portion of the surface along with a lens and an optical sensor.

FIG. 1 illustrates a preferred embodiment of a portion of a surface made in accordance with the teachings of the present invention, hereinafter referred to as a surface portion 11. Depressions 13 are located on the surface portion 11 in either an ordered or random fashion. The areas between the depressions 13 are non-distorted regions 17. The surface portion 11 is scanned by an optical sensor 16, which exists in prior art. A lens 10, also from prior art, is fixed in front of the optical sensor 16, between the optical sensor 16 and the surface portion 11. The lens 10 projects an image of the surface portion 11 onto the optical sensor 16.

Figure 2:
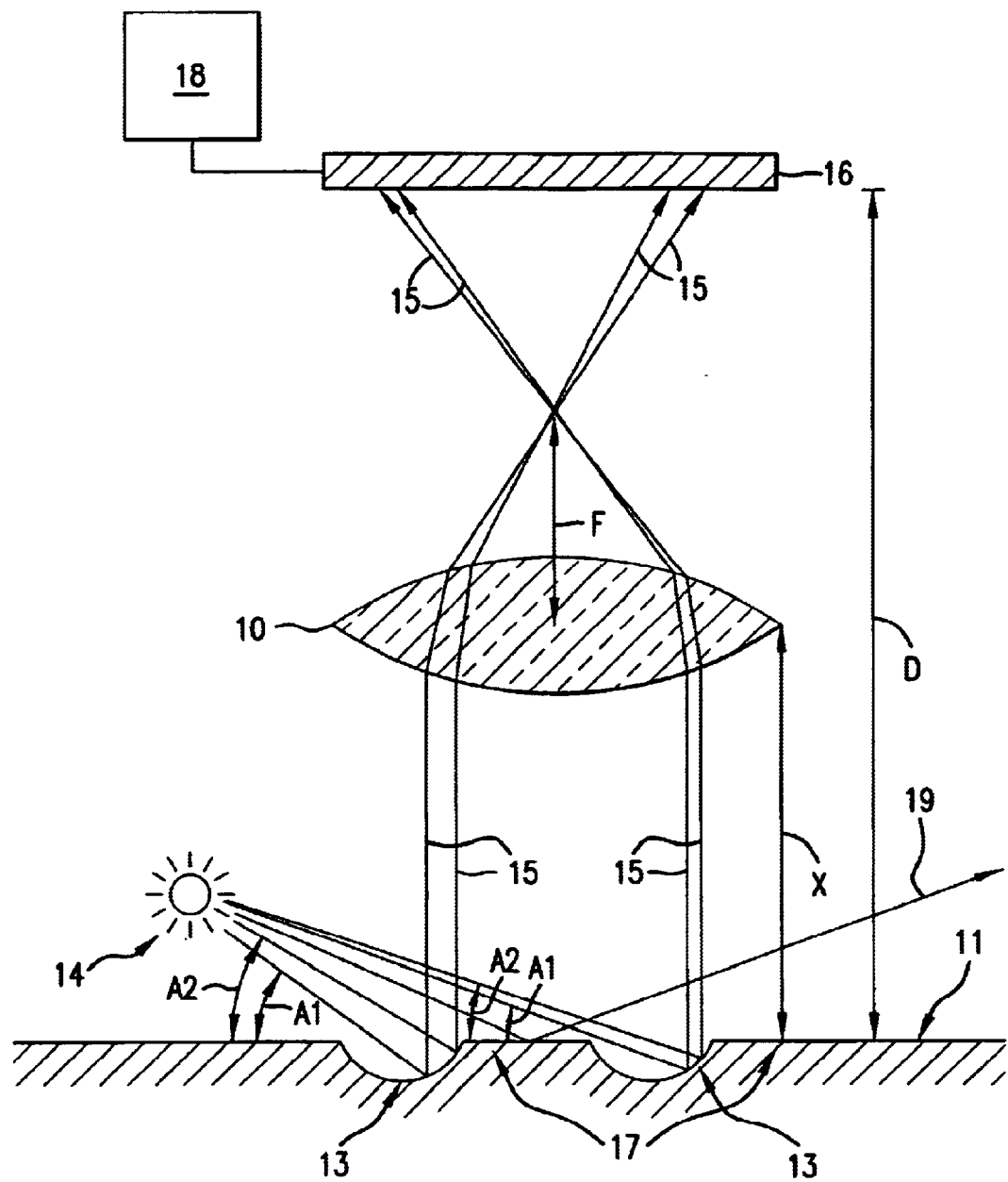
FIG. 2 is a cross-sectional side view of the objects in FIG. 1, taken along a vertical plane passing through line C–C' shown in FIG. 1. A light source and relative position determinator have been added, and the light beams from the light source reflect off of multiple depressions.

FIG. 2 shows a cross-sectional side view of the surface portion 11, lens 10, and optical sensor 16, taken along a vertical plane passing through the line indicated by C–C' in FIG. 1. A light source 14 is added, as well as a relative position determinator 18 that is electrically coupled to the optical sensor 16. The relative position determinator 18 is a device well known in the art, and is found in common computer input devices such as trackballs and mice. The optical sensor 16 lies a distance D away from the surface portion 11. The lens 10 has a focal length F, and lies a distance X away from the surface portion 11. The distance X is chosen by determining the image size to be projected by the lens 10 onto the optical sensor 16. The preferred embodiment uses a 1:1 image ratio, with X=2F and D=4F. To obtain a 2:1 image ratio, use X=3F and D=4.5F. Other image ratios are possible by varying distance X, distance D, and focal length F.

The light source 14 shines light beams onto the surface portion 11. The light source 14 is preferably a light-emitting diode, although any light-emitting device can be used. The depressions 13 are shaped such that light beams 15, with angles of incidence A1 through A2, hit the depressions 13 and are reflected towards the lens 10. The lens projects the light beams 15 onto the optical sensor 16. The angles at which the light beams 15 hit the surface portion 11 will vary depending on the positioning of the light source 14. The light beams used to develop the present invention had an angle of incidence upon the surface portion 11 of approximately 20 to 30 degrees. In the embodiment shown, the optical sensor 16 and lens 10 are located directly above the lighted region; therefore, the depressions 13 of this embodiment should be shaped to reflect the light beams 15 normal to the surface portion 11.

The surface portion 11 is made of machined metal, molded plastic, aluminized mylar, or any other material that has the ability to hold small features. The depressions 13 should be made of or coated with a specular material that reflects light. A material is specular if a light beam hitting the material has an angle of incidence equal to its angle of reflectance. The non-distorted regions 17 are made of or coated with the same specular material as the depressions 13. This is the preferred embodiment and the simplest to manufacture. The non-distorted regions 17 are also made of or coated with a diffuse light-scattering material, or any other material as long as the non-distorted regions 17 do not reflect incident light towards the lens 10. The non-distorted regions 17 reflect incident light away from the lens 10, such as the example of deflected light beam 19. Although the surface portion 11 in FIGS. 1 and 2 is drawn as flat and planar, the surface portion 11 can be curved, bent, or any other shape that can hold the depressions 13.

Since the light beams 15 can have varying angles of incidence due to the variance in the positioning of the light source 14, the shape of the depressions 13 can also vary. One possibility for the shape of the depressions 13 is a smoothly curved surface, like the inside of a bowl. The curvature of the depressions 13 are shaped to allow light beams 15 with a range of angles of incidence A1 through A2 to be reflected toward the lens 10 and optical sensor 16. Other shapes can also be used. For instance, a curved surface can be approximated by a faceted depression 13 with from three to an infinite number of sides. For optimal performance, the depressions 13 should be rotationally symmetric, because the orientation of the optical sensor 16 to the surface portion 11 can be random.

The relative position determinator 18 acquires the images of surface portion 11 projected onto optical sensor 16 by lens 10, as the optical sensor 16 moves relative to the surface portion 11. This relative movement can be achieved by moving the optical sensor 16 over the surface portion 11, which is the situation when the relative position determinator 18 is an optical mouse. The relative movement can also be obtained by keeping the optical sensor 16 stationary while the surface portion 11 is moved, which is the case when the relative position determinator 18 is a trackball device. A combination of both methods can also be used, as long as there is relative movement between the optical sensor 16 and the surface portion 11.

Figure 3:
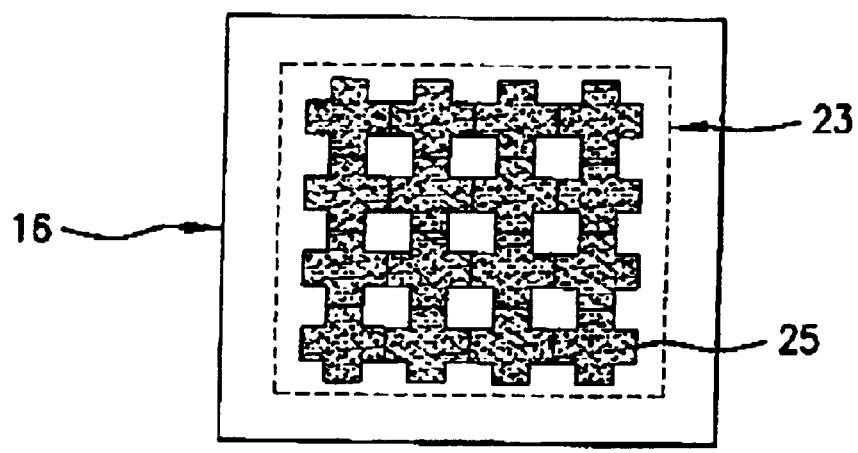
FIG. 3 is a detailed view of the pixels in the optical sensor shown in FIGS. 1 and 2.

FIG. 3 depicts an exemplary optical sensor 16 that exists in prior art, showing the side of the optical sensor 16 that faces the lens 10 in FIG. 1. The optical sensor 16 typically has a pixel array 23, a structure well known in the art. The pixel array 23 comprises individual pixels 25 arranged in a close-packed grid. A pixel 25 is the smallest unit in the optical sensor 16 that is capable of detecting an image. A depression 13 is detectable by a pixel 25 if the image of the depression 13 is larger than the pixel 25. Only half of the depression 13 can show up in an image sensed by the optical sensor 16, since light can only bounce off of half of the depression 13 at any given time. If a 1:1 image of the surface portion 11 is projected by the lens 10 (shown in FIG. 2) onto the optical sensor 16, the size of each depression 13 should be at least twice as large as a pixel 25.

The depressions 13 are spaced such that at least one depression 13 is detectable by the pixel array 23 of the optical sensor 16 at all times. To account for the possibility of noise, and for improved performance, two or more depressions 13 should be detectable by the pixel array 23 at any given time. The depressions 13 should not be on the same spacing as the pixels 25 in the pixel array 23 in order to avoid aliasing.

Figure 4:
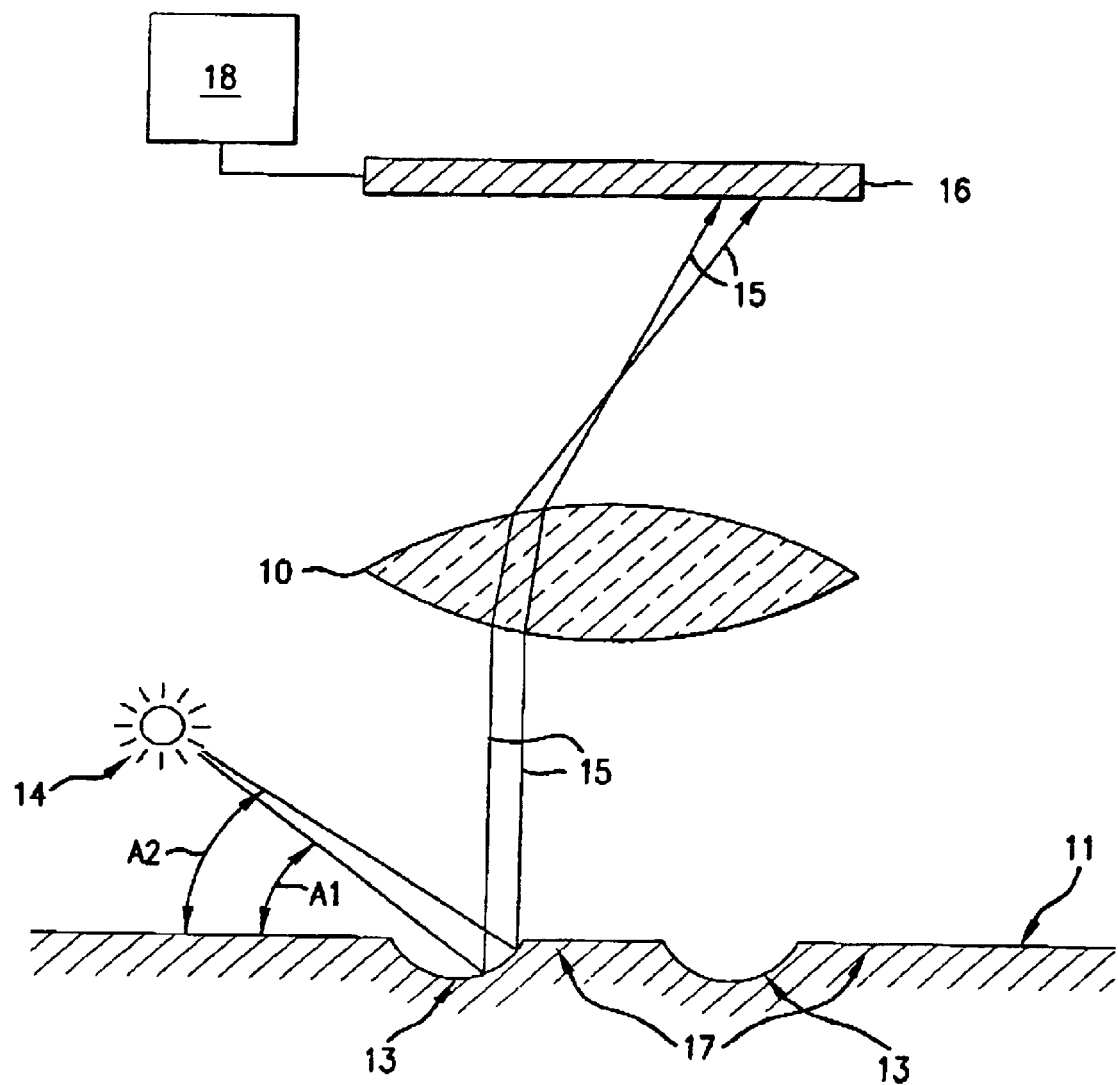
FIG. 4 is a cross-sectional side view of the objects shown in FIG. 2. The light beams from the light source reflect off of a single depression.

The optical sensor 16 is able to detect light beams 15 reflecting off of multiple depressions 13. FIG. 2 only shows light beams 15 reflecting off of two depressions, since it is a cross-sectional view, but the optical sensor 16 is able to detect light beams 15 reflecting off of all depressions 13 immediately underneath the optical sensor 16 and lens 10. For example, all the depressions 13 shown in FIG. 1 will be detected by the optical sensor 16, since they are all immediately underneath the optical sensor 16 and lens 10. Although it is preferable to have multiple depressions 13 underneath the optical sensor 16 at all times, the relative position determinator 18 will still work if light beams 15 only reflect off of a single depression 13 toward the lens 10 and optical sensor 16, as is shown in FIG. 4.

Figure 5:
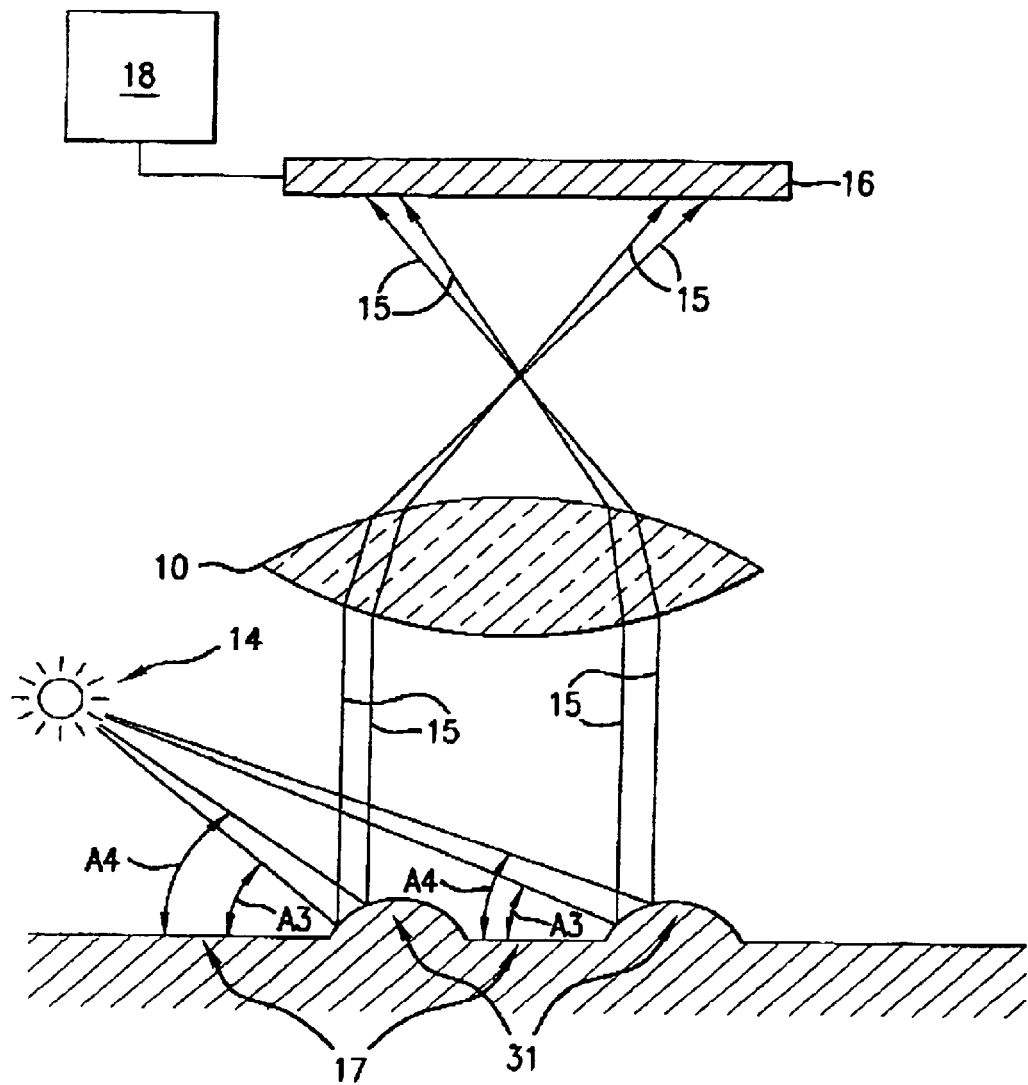
FIG. 5 is a cross-sectional side view of a portion of a surface with protrusions, a lens, an optical sensor, light source, and relative position determinator.

FIG. 5 shows another embodiment of the present invention. The depressions 13 of FIG. 2 are replaced with protrusions 31. The curvatures of the protrusions 31 are shaped such that light beams 15 with angles of incidence A3 through A4 are reflected toward the lens 10. The protrusions 31 should be rounded and rotationally symmetric for optimal performance. If a 1:1 image of the surface portion 11 is projected by the lens 10 onto the optical sensor 16, the size of each protrusion 31 should be at least twice as large as a pixel 25 (shown in FIG. 3). The protrusions 31 are spaced such that at least one protrusion 31 is detectable by the pixel array 23 of the optical sensor 16 shown in FIG. 3 at all times. To minimize the possibility of aliasing, the protrusions 31 should be on a different spacing than the pixels 25 in the pixel array 23. The protrusions 31 can also be approximated by faceted protrusions 31 with from three to infinite sides. The surface portion 11 and non-distorted regions 17 remain as described in FIG. 2.

Figure 6A:
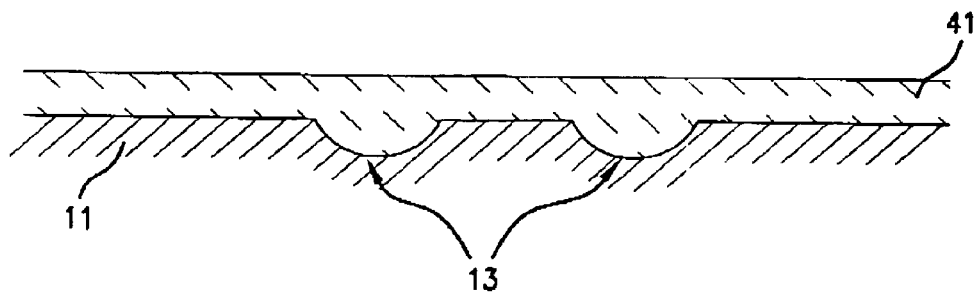
FIG. 6A is a cross-sectional side view of the surface with depressions and an optically transparent coating.
Figure 6B:
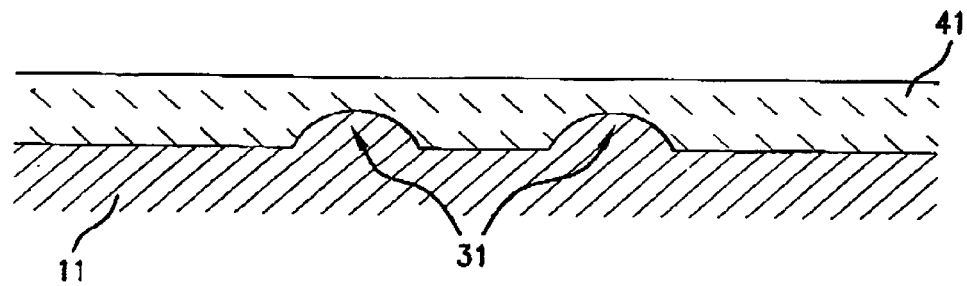
FIG. 6B is a cross-sectional side view of the surface with protrusions and an optically transparent coating.

In FIGS. 6A and 6B, the present invention is covered with an optically transparent coating 41 that protects the surface portion 11 from contamination and damage. In FIG. 6A, the surface portion 11 and the depressions 13 are covered with the optically transparent coating 41. This prevents foreign particles from falling into the depressions 13 and blocking the incoming light. In FIG. 6B, the optically transparent coating 41 fills the valleys between the protrusions 31 and covers the surface portion 11. This prevents the protrusions 31 from wearing down as the lens 10 and optical sensor 16 pass over it.

Figure 7:
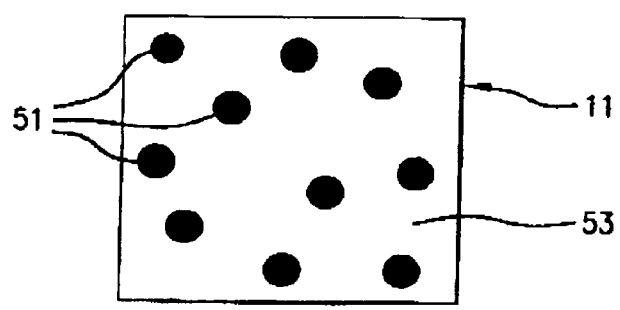
FIG. 7 is a top-down, blown-up and partial view of the surface with dark colored areas against a lighter colored background.

A final embodiment of the present invention is shown in FIG. 7. FIG. 7 is a top-down, blown-up partial view of the surface portion 11. This illustrated embodiment has contrasting regions of two colors, although more colors can be used. A first color is used in colored regions 51 against a background 53 of a second color. The colored regions 51 can be any shape, but for convenience of illustration the colored regions 51 in this embodiment are circular. For optimal performance, the colored regions 51 should be darker than the background 53. The lighter the background 53, the less light is needed to illuminate the surface portion 11, which results in less power being consumed. For example, the colored regions 51 can be black while the color of the background 53 can be white, as shown in FIG. 7. The optimal colors for the colored regions 51 and the background 53 depend on the wavelength of light being shined on the surface portion 11 from the light source 14 shown in FIG. 2. If a 1:1 image of the surface portion 11 is projected by the lens 10 onto the optical sensor 16, the size of each colored region 51 should be at least the size of a pixel 25 shown in FIG. 3, and spaced such that at least one colored region 51, is detectable by the pixel array 23 of the optical sensor 16 shown in FIG. 3. The colored regions 51 should not duplicate the spacing of the pixels 25 in the pixel array 23 to avoid aliasing.

Although the present invention has been described in detail with reference to particular preferred embodiments, persons possessing ordinary skill in the art to which this invention pertains will appreciate that various modifications and enhancements may be made without departing from the spirit and scope of the claims that follow.

I claim:

1. A surface scanned by an optical sensor of a relative position determinator, for use with a light source, comprising:

first specular regions that reflect light beams from the light source toward the optical sensor, in the form reflected light beams; and second specular regions that reflect light from the light source away from the optical sensor, in the form of deflected light beams, wherein only the reflected light beams from the first region form an image used by the relative position determinator to detect chance in the position of the optical sensor relative to the surface, wherein the first regions are rotationally symmetric and located indiscriminately amidst the second regions, the first regions being selected from a group consisting of surfaces containing depressions, surface protrusions, and a combination of surfaces containing depressions and surface protrusions.

2. The surface as in claim 1, wherein the first regions are sized to be detectable by the optical sensor.

3. The surface in claim 2, wherein the second regions surround the first regions.

4. The surface as in claim 3, wherein the surface is covered with an optically transparent coating.

5. A method for determining the position of an optical sensor relative to a surface, wherein the optical sensor is part of a relative position determinator, to be used with a light source that illuminates the surface, comprising the steps of:

shining light from the light source onto the surface;

reflecting light from a first group of specular regions on the surface toward the optical sensor, in the form of reflected light beams, wherein the first group of specular regions is made up of rotationally symmetric elements;

reflecting light from a second group of specular regions on the surface away from the optical sensor, in the form of deflected light beams, wherein the first group of regions are indiscriminately located amidst the second group of regions; and forming an image with only the reflected light beams from the first group of regions, the image used by the relative position determinator to detect change in the position of the optical sensor relative to the surface.

6. The method of claim 5, wherein the surface is covered with an optically transparent coating.

7. The method of claim 6, wherein the first group of regions is made up of surfaces containing depressions.

8. The method of claim 6, wherein the first group of regions is made up of surfaces containing protrusions.

* * * * *